United States Patent
Mishima et al.

(10) Patent No.: US 9,768,332 B2
(45) Date of Patent: Sep. 19, 2017

(54) INFRARED DETECTION ELEMENT

(71) Applicant: HAMAMATSU PHOTONICS K.K., Hamamatsu-shi, Shizuoka (JP)

(72) Inventors: Asuka Mishima, Hamamatsu (JP); Yoshinori Oshimura, Nagoya (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/033,945

(22) PCT Filed: Oct. 31, 2014

(86) PCT No.: PCT/JP2014/079105
§ 371 (c)(1),
(2) Date: May 3, 2016

(87) PCT Pub. No.: WO2015/068658
PCT Pub. Date: May 14, 2015

(65) Prior Publication Data
US 2016/0268461 A1    Sep. 15, 2016

(30) Foreign Application Priority Data
Nov. 5, 2013   (JP) ................................ 2013-229629

(51) Int. Cl.
| | | |
|---|---|---|
| H01L 31/00 | (2006.01) | |
| H01L 31/0304 | (2006.01) | |
| H01L 31/0336 | (2006.01) | |
| H01L 31/0352 | (2006.01) | |

(52) U.S. Cl.
CPC .... H01L 31/03046 (2013.01); H01L 31/0304 (2013.01); H01L 31/0336 (2013.01); H01L 31/035236 (2013.01); *Y02E 10/544* (2013.01)

(58) Field of Classification Search
CPC .......... H01L 31/03046; H01L 31/0336; H01L 31/035236
USPC ....................................................... 257/441
See application file for complete search history.

(56) References Cited

U.S. PATENT DOCUMENTS

| | | | | |
|---|---|---|---|---|
| 2009/0321785 | A1* | 12/2009 | Iguchi ................... | B82Y 20/00 |
| | | | | 257/184 |
| 2016/0290865 | A1* | 10/2016 | Delaunay .............. | G01J 3/2803 |

FOREIGN PATENT DOCUMENTS

| | | |
|---|---|---|
| CN | 101971367 | 2/2011 |
| CN | 102334197 | 1/2012 |
| EP | 2 648 234 | 10/2013 |
| JP | 2001-156324 A | 6/2001 |
| JP | 2004-200480 | 7/2004 |

(Continued)

OTHER PUBLICATIONS

International Preliminary Report on Patentability dated May 10, 2016 for PCT/JP2014/079105.

(Continued)

*Primary Examiner* — David S Blum
(74) *Attorney, Agent, or Firm* — Drinker Biddle & Reath LLP

(57) ABSTRACT

This infrared detection element includes a buffer layer (InAsSb layer) 3, a buffer layer (InAs layer) 4, and a light absorption layer (InAsSb layer) 5. A critical film thickness hc of the InAs layer satisfies a relation of hc<t with a thickness t of the InAs layer. In this case, it is possible to improve crystallinities of the buffer layer 4 of InAs and the light absorption layer 5 of InAsSb formed on the buffer layer 3.

4 Claims, 9 Drawing Sheets

(56) References Cited

FOREIGN PATENT DOCUMENTS

| JP | 2008-171912 A | 7/2008 |
| JP | 2009-246207 A | 10/2009 |
| JP | 2012-256826 A | 12/2012 |

OTHER PUBLICATIONS

International Preliminary Report on Patentability dated May 19, 2016 for PCT/JP2014/079105.

Liu B-D et al., "INAS Room Temperature Infrared Photoconductive Detectors Grown By Molecular-Beam Epitaxy", Journal of vacuum science and technology, part B, AVS/AIP, Melville, New York, NY, US, vol. 15, No. 2., ISSN: 1071-1023, DOI:10.116/1.589314., Mar. 1, 1997, p. 321-324, XP000729013.

Lackner D. et al., "InAsSb and InPSb materials for mid infrared photodectors", Indium Phosphide & Related Materials (IPRM), ISBN: 978-1-4244-5919-3, May 31, 2010, p. 1-4, XP031712589.

\* cited by examiner

| ELEMENT | MATERIAL | CONDUCTIVITY TYPE | IMPURITY CONCENTRATION ($cm^{-3}$) | THICKNESS ($\mu m$) |
|---|---|---|---|---|
| CAP LAYER 7 | InAsSb | P | NOT LESS THAN $2\times10^{18}$ NOT MORE THAN $1\times10^{19}$ | 0.5 |
| BARRIER LAYER 6 | AlInAsSb | P | NOT LESS THAN $2\times10^{18}$ NOT MORE THAN $1\times10^{19}$ | 0.02 |
| LIGHT ABSORPTION LAYER 5 | InAsSb | N- | NOT MORE THAN $2\times10^{17}$ | 2.0 |
| BUFFER LAYER 4 | InAs | N | NOT LESS THAN $2\times10^{18}$ NOT MORE THAN $5\times10^{18}$ | 0.5 |
| BUFFER LAYER 3 | InAsSb | N- | NOT MORE THAN $2\times10^{17}cm^{-3}$ | 0.5 |
| BUFFER LAYER 2 | GaAs | - | NOT MORE THAN $1\times10^{15}cm^{-3}$ | 0.2 |
| SEMICONDUCTOR SUBSTRATE 1 | GaAs | - | NOT MORE THAN $1\times10^{15}cm^{-3}$ | 250 |

Fig.7

| FORMULA(1) | $h_c = \dfrac{b}{4\pi f} \dfrac{(1 - v\cos^2 \alpha)}{(1+v)\cos \lambda} \left( \ln \dfrac{h_c}{b} + 1 \right)$ |
|---|---|
| FORMULA(2) | $h_c = \dfrac{a}{2\sqrt{2}\pi f} \dfrac{\left(1 - \dfrac{v}{4}\right)}{(1+v)} \left( \ln \dfrac{\sqrt{2}h_c}{a} + 1 \right)$ |
| FORMULA(3) | $h_c = \dfrac{a}{\sqrt{2}\pi f} \dfrac{\left(1 - \dfrac{v}{4}\right)}{(1+v)} \left( \ln \dfrac{\sqrt{2}h_c}{a} + 1 \right)$ |
| FORMULA(4) | $a = a_{InAs}$ |
| FORMULA(5) | $f = \dfrac{|a_{InAs} - a_{InAsSb}|}{a_{InAsSb}}$ |
| FORMULA(6) | $a_{InAsSb} = X \times a_{InAs} + (1 - X) \times a_{InSb}$ |

*Fig.8*
(A)
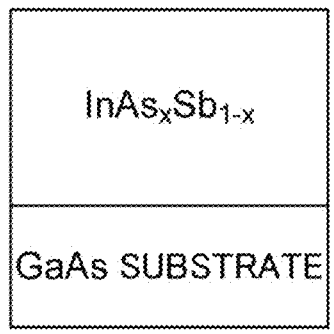
(B)
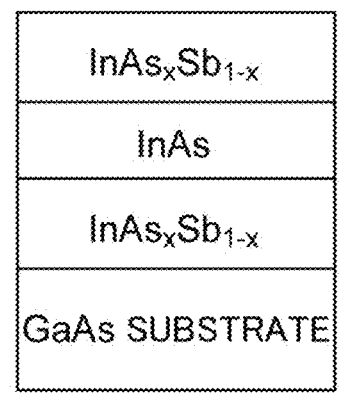

INFRARED DETECTION ELEMENT

TECHNICAL FIELD

The present invention relates to an infrared detection element made of compound semiconductors of an InAsSb/InAs/InAsSb structure.

BACKGROUND ART

The conventional infrared detection element is described in Patent Literature 1. This infrared detection element has a structure that sandwiches an intermediate layer (InAsSb, GaInSb, AlAs, InAs, GaAs, AlSb, or GaSb) by upper and lower compound semiconductor layers (InSb, InAsSb, or InSbN). According to this literature, in the case of such a structure, there was given a finding that element characteristics could be improved by setting the intermediate layer to be of a superlattice structure and setting the thicknesses of the layers that make up the superlattice structure to be less than or equal to a critical film thickness.

CITATION LIST

Patent Literature

Patent Literature 1: Japanese Unexamined Patent Publication No. 2009-246207

SUMMARY OF INVENTION

Technical Problem

However, the inventors of this application have discovered that in the above-mentioned conventional technology, in the case where an intermediate layer includes InAs and upper and lower compound semiconductor layers are InAsSb, it is not possible to improve element characteristics by setting a film thickness of the intermediate layer to be less than or equal to a critical film thickness.

The present invention was made in view of such a problem, and has an object to provide an infrared detection element that can have excellent detection characteristics in the case where the intermediate layer is InAs and the upper and lower compound semiconductor layers are InAsSb.

Solution to Problem

In the conventional technology, it is thought that a reason for setting thicknesses of the layers that make up the intermediate layer to be the critical film thickness or less is based on a finding that if a stress working on each of the layers exceeds the critical film thickness, each crystallinity will deteriorate. In other words, it was considered that when the InAs layer has film thickness less than or equal to the critical film thickness, crystal defects of each InAs layer could be improved.

However, in contrast to the conventional finding, the inventors of this application have discovered that especially in the case of a structure where an intermediate layer is sandwiched between a pair of InAsSb layers and besides when a superlattice structure containing an InAs layer is adopted in this intermediate layer, defects of dislocation, such as crack and misfit dislocation, and the like will extend from an interface of the InAsSb layer that is a base and the InAs layer at the time of crystal growth, and growth of the extended defects cannot be stopped in the InAs layer of a thin thickness. Then, the inventors have discovered that when the superlattice structure is not adopted and a thickness of the InAs layer is set larger than the critical film thickness, the growth of the defects extending from the interface stops, which improves the crystallinities of these compound semiconductor layers, and improves detection characteristics.

That is, the infrared detection element according to a mode of the present invention includes a first InAsSb layer, an InAs layer grown on the first InAsSb layer, and a second InAsSb layer grown on the InAs layer, in which a critical film thickness hc of the InAs layer and a thickness t of the InAs layer satisfy a relation of hc<t.

In this case, the infrared detection element becomes possible to have the excellent detection characteristics.

Especially, in the case where each of the composition ratios X of As in the first InAsSb layer and the second InAsSb layer is not less than 0.58 and not more than 1.0 and still more preferably, in the case where they are not less than 0.7 and not more than 0.9, it is possible to improve the crystallinities of the InAs layer and the second InAsSb layer.

Moreover, it is preferable that the thickness t of the InAs layer further satisfy t≤2.0 μm. This is because when the thickness t exceeds 2.0 μm, a manufacturing process time becomes considerably long and manufacture is not suitable for mass production.

Advantageous Effects of Invention

The infrared detection element of the present invention can have the excellent detection characteristics.

BRIEF DESCRIPTION OF DRAWINGS

FIG. 2 is a chart showing materials, conductivity types, impurity concentrations, and thicknesses of respective layers.

FIG. 7 is a chart for describing a calculation formula of the critical film thickness hc.

FIG. 8-(A) and FIG. 8-(B) are diagrams showing a layered structure used in order to perform X-ray diffraction measurement.

DESCRIPTION OF EMBODIMENTS

Figure 1:
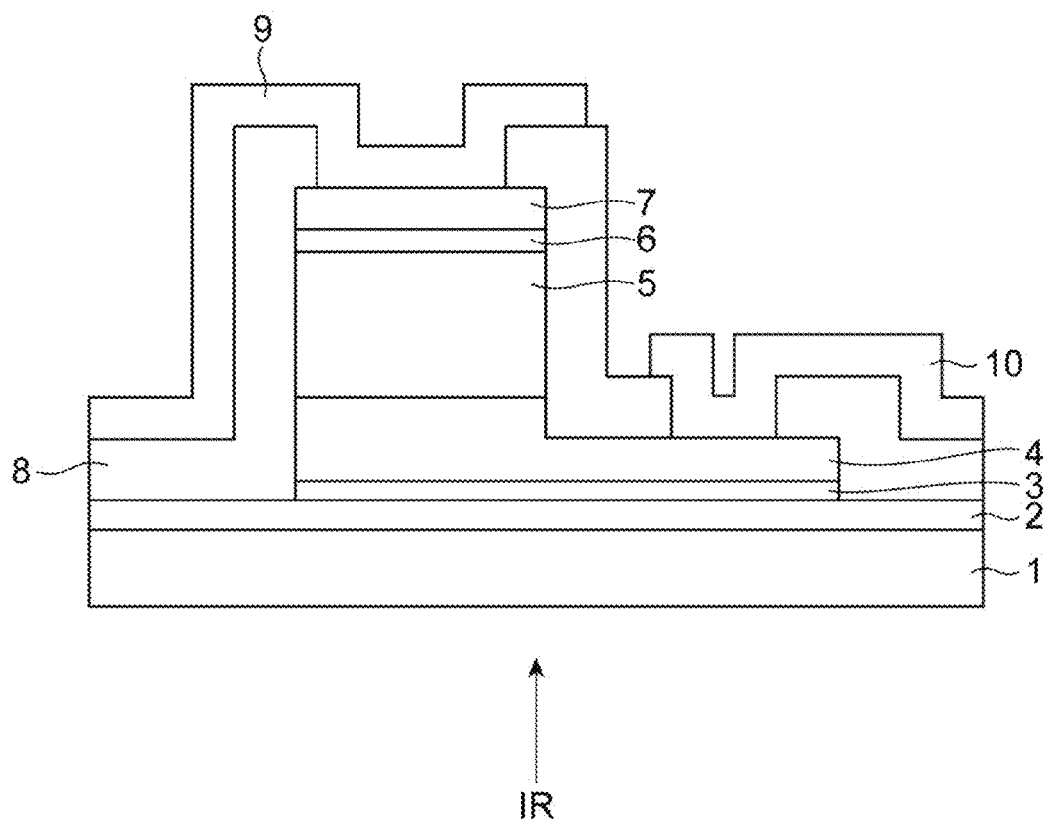
FIG. 1 is a diagram showing a cross section structure of an infrared detection element.

Hereinafter, an infrared detection element according to an embodiment is described. A same reference numeral is used for a same element, and overlapping description is omitted.

FIG. 1 is a diagram showing a cross section structure of the infrared detection element.

This infrared detection element has multiple compound semiconductor layers, and is provided with a semiconductor structure that is formed by successively layering a buffer layer 2, a buffer layer 3 (first InAsSb layer), a buffer layer 4 (InAs layer), a light absorption layer 5 (second InAsSb layer), a barrier layer 6, and a cap layer 7 on a semi-insulating semiconductor substrate 1. Each of these compound semiconductor layers is grown on the semiconductor substrate 1 by a molecular beam epitaxy (MBE) method.

A part of an area of the semiconductor structure is removed by being etched from the surface side. That is, parts of the areas of the cap layer 7, the barrier layer 6, the light absorption layer 5, and the buffer layer 4 are etched along a thickness direction from respective surfaces of these, and this etching exposes a surface of the buffer layer 4 and forms a mesa structure. Moreover, a surface of the semi-insulating buffer layer 2 formed to be non-doped is also subjected to etching between the elements until a part thereof is exposed, and the infrared detection element s that are adjacent to each other at the time of manufacture are separated. That is, after the surface of the buffer layer 4 is exposed, further, etching of the buffer layer 4 and the buffer layer 3 is performed so that the infrared detection element may be surrounded by effect separation between the elements. Both dry etching and wet etching can be adopted for the etching described above.

A protection layer 8 is formed so as to cover a surface of the buffer layer 2, the surface of the buffer layer 4, a side face of the semiconductor structure, and a partial surface of the cap layer 7. The protection layer 8 is made of an inorganic insulator, such as silicon oxide ($SiO_2$) or silicon nitride (SiNx), protects each infrared detection element, and prevents short circuit between the adjacent infrared detection element s that is caused by dirt, dust, and the like, which maintains insulation among these elements. Although the multiple infrared detection element s can also be used being separated individually after the manufacture, they can also be used as an infrared photodiode array because insulation between the respective elements is maintained.

A part of an area of the protection layer 8 is removed and an electrode is formed in a contact hole formed by the removal. That is, in the contact hole of the protection layer 8 on the cap layer 7, a first electrode 9 is formed to contact the cap layer 7; in the contact hole of the protection layer 8 on the buffer layer 4, a second electrode 10 is formed to contact the buffer layer 4. Since when infrared radiation IR enters from the substrate side, the electrode material is not limited in particular as long as it makes ohmic contact with a target compound semiconductor layer, metals such as gold (Au) and aluminum (Al) can be used for it.

In the case where the infrared radiation enters from an opposite of the substrate, the electrode material is not limited in particular as long as it makes ohmic contact with a target compound semiconductor layer on a condition that it is made of a material that allows the infrared radiation to penetrate or is in a shape of a thin metal film or others having mesh or an opening. Also, in this case, for electrode metals, a metal such as gold and aluminum described above can be used.

The semiconductor structure described above constitutes an infrared photodiode. That is, light that entered the light absorption layer 5 from the back side of the semiconductor substrate 1 passing through the semiconductor substrate 1 and the buffer layers 2, 3, and 4 successively is subjected to photoelectric conversion in the light absorption layer 5, which creates hole-electron pairs in the light absorption layer 5. Size relations of energy band gaps E6, E5, and E4 of the respective layers of the barrier layer 6, the light absorption layer 5, the buffer layer 4 satisfy E6>E5 and E4>E5. A lattice constant a6 of the barrier layer 6, a lattice constant a5 of the light absorption layer 5, and a lattice constant a4 of the buffer layer 4 can be set to a6<a5 and a4<a5, for example.

Incidentally, since when infrared radiation is entered from the surface side, a part of infrared radiation is greatly absorbed by the cap layer 7, it is preferable that the infrared radiation IR be made to enter from the back side. The infrared radiation IR can enter the light absorption layer 5 after penetrating the semiconductor substrate 1 and the buffer layers 2 and 4 whose energy band gaps are larger than that of the light absorption layer 5. Incidentally, although the infrared radiation IR also penetrates the buffer layer 3 whose thickness is thinner than that of the light absorption layer after passing through the buffer layer 2, since some absorption occurs here, the buffer layer 3 may have as thin a thickness as possible. However, in the case where the buffer layer 3 is too thin, crystallinity of the buffer layer 4 thereon deteriorates; therefore, it is preferable that a thickness of the buffer layer 3 be not less than 0.1 μm and not more than 0.5 μm.

With incidence of the infrared radiation IR to the light absorption layer 5, inclination of the energy level formed by these energy band gaps makes it difficult for electrons generated in the light absorption layer 5 to diffuse in a direction of the barrier layer 6. Moreover, since the cap layer 7 and the barrier layer 6 are P type, the light absorption layer 5 is non-doped, and the buffer layer 4 is N type, a PIN photodiode is configured with these. In a no-bias state, a diffusion potential occurs in the inside of the PIN photodiode, a potential of the N-type buffer layer 4 from which electrons as a carrier escaped is charged positive, and potentials of the P-type cap layer 7 from which holes as a carrier escaped and the barrier layer 6 are charged negative. Therefore, the electrons generated in the light absorption layer 5 move in a direction of the buffer layer 4 according to the inclination of diffusion potential and the energy level, while holes move in the direction of the barrier layer 6. These carriers can be taken out to the outside by the first electrode 9 and the second electrode 10 that contact the cap layer 7 and the semiconductor substrate 1, respectively.

FIG. 2 is a chart showing materials, conductivity types, impurity concentrations, and thicknesses of the respective layers. For impurities of the P type in InAsSb and AlInAsSb, Zn, Be, C, Mg, or the like can be used; for impurities of the N type, Si, Te, Sn, S, Se, or the like can be used. As one concrete example, a P-type impurity in InAsSb and AlInAsSb is Zn, and an N-type impurity in InAs is Si.

As shown in the diagram, materials, conductivity types, impurity concentrations, and thicknesses of the respective layers are as follows.

Cap layer 7:
InAsSb/P type/$2\times10^{18}$ to $1\times10^{19}$ $cm^{-3}$/0.5 μm
Barrier layer 6:
AlInAsSb/P type/$2\times10^{18}$ to $1\times10^{19}$ $cm^{-3}$/0.02 μm
Light absorption layer 5:
InAsSb/$N^-$ type (non-doped)/$2\times10^{17}$ $cm^{-3}$ or less/2.0 μm
Buffer layer 4:
InAs/N type/$2\times10^{18}$ to $5\times10^{18}$ $cm^{-3}$/0.5 μm
Buffer layer 3:
InAsSb/$N^-$ type (non-doped)/$2\times10^{17}$ $cm^{-3}$ or less/0.5 μm
Buffer layer 2:
GaAs/semi-insulating type (non-doped)/$1\times10^{15}$ $cm^{-3}$ or less/0.2 μm
Semiconductor substrate 1:
GaAs/semi-insulating type/$1\times10^{15}$ $cm^{-3}$ or less/250 μm Semiconductor substrate 1:

Incidentally, even if impurity variation arises within a range that is not less than 0.1×C and not more than 10×C with each impurity concentration described above of each layer designated as C, a large change will not occur in operation effect; therefore, it is thought that the infrared photodiode functions as the infrared detection element with excellent characteristics, Desirably, each of the impurity concentrations of each layer is in a range of the above-mentioned impurity concentrations (carrier concentrations).

Here, it is assumed that a composition ratio X1 of As in the case where the buffer layer 3 made of InAsSb is made of $InAs_{X1}Sb_{1-X1}$ and a composition ratio X2 of As in the case where the light absorption layer 5 is made of $InAs_{X2}Sb_{1-X2}$ are equal (X1=X2). Incidentally, even if X2 has an error of ±30% to X1, there will be no significant difference in crystal growth.

A critical film thickness hc of the buffer layer (InAs layer) 4 made of the InAs layer and a thickness t of the buffer layer 4 satisfy a relation of hc<t.

Here, a method for obtaining the critical film thickness hc is described.

FIG. 7 is a chart for describing a formula of the critical film thickness hc.

Formula (1) shows a formula of Matthews about the critical film thickness of the intermediate layer of a double hetero-structure (described in J. Cryst. Growth, 27, 118 (1974) by J. W. Matthews and A. E. Blackeslee, and like), which is derived based on a force exerting to dislocation in the heterointerface of two layers. In Formula (1), hc represents the critical film thickness of InAs, f represents a degree of lattice mismatching, ν represents a Poisson's ratio, and b represents a Burgers vector. In the case of a zinc blend structure, b=a/√2, cos α=½, and cos λ=½, which are substituted into Formula (1), and Formula (1) is arranged to obtain Formula (2).

When considering a crystal growth order of the embodiment, attention should be paid to an InAs/InAsSb structure (=single heterostructure). That is, in the single heterostructure that is growing, as compared with the double hetero-structure, when the number of the heterointerfaces is reduced by one, a tension that the InAs layer receives from the heterointerface is reduced by half, and the critical film thickness is increased by two times. In this case, Formula (2) is modified into as Formula (3).

A variable of As composition in Formula (3) is a degree of lattice mismatching f. Since both InAs and InSb are ν=0.35, in InAsSb that is a mixed crystal thereof, it can be set to have ν=0.35 regardless of the As composition.

Moreover, when the As composition X of InAsSb, a lattice constant $a_{InAs}$ of InAs, and a lattice constant $a_{InSb}$ of InSb are used, a=$a_{InAs}$ of Formula (4) is substituted into the lattice constant a, and the degree of lattice mismatching f can be obtained by Formula (5). Incidentally, the lattice constant of InAsSb is $a_{InAsSb}$. Moreover, the lattice constant $a_{InAsSb}$ of InAsSb that is the mixed crystal can be obtained as in Formula (6) from Vegard's law. Substituting values of Formula (4) to Formula (6) into Formula (3), the critical film thickness hc also in consideration of the As composition is obtained.

Here, in the case where the critical film thickness hc of InAs is hc<thickness t, the infrared detection element becomes possible to have the excellent detection characteristics with less noise (with a high specific detectivity). This is because, in the infrared detection element of an InAsSb/InAs/InAsSb structure, growth of the crystal defects extending from the interface of the InAs layer and the InAsSb layer that is a base can be stopped. Therefore, this is because the crystallinities of these compound semiconductor layers are improved and the detection characteristics are improved by setting a thickness of the buffer layer 4 (InAs layer) that is the intermediate layer to be larger than the critical film thickness hc. Moreover, in order to make a device process easy, it is preferable that the thickness t of the buffer layer 4 be 0.5 μm≤t and it is preferable that the thickness t be t≤2.0 μm. That is, when the thickness t exceeds 2.0 μm, the manufacturing process time becomes considerably long and the manufacture becomes unsuitable for mass production.

Next, a critical film thickness hc of the InAs layer is further described.

Figure 6:
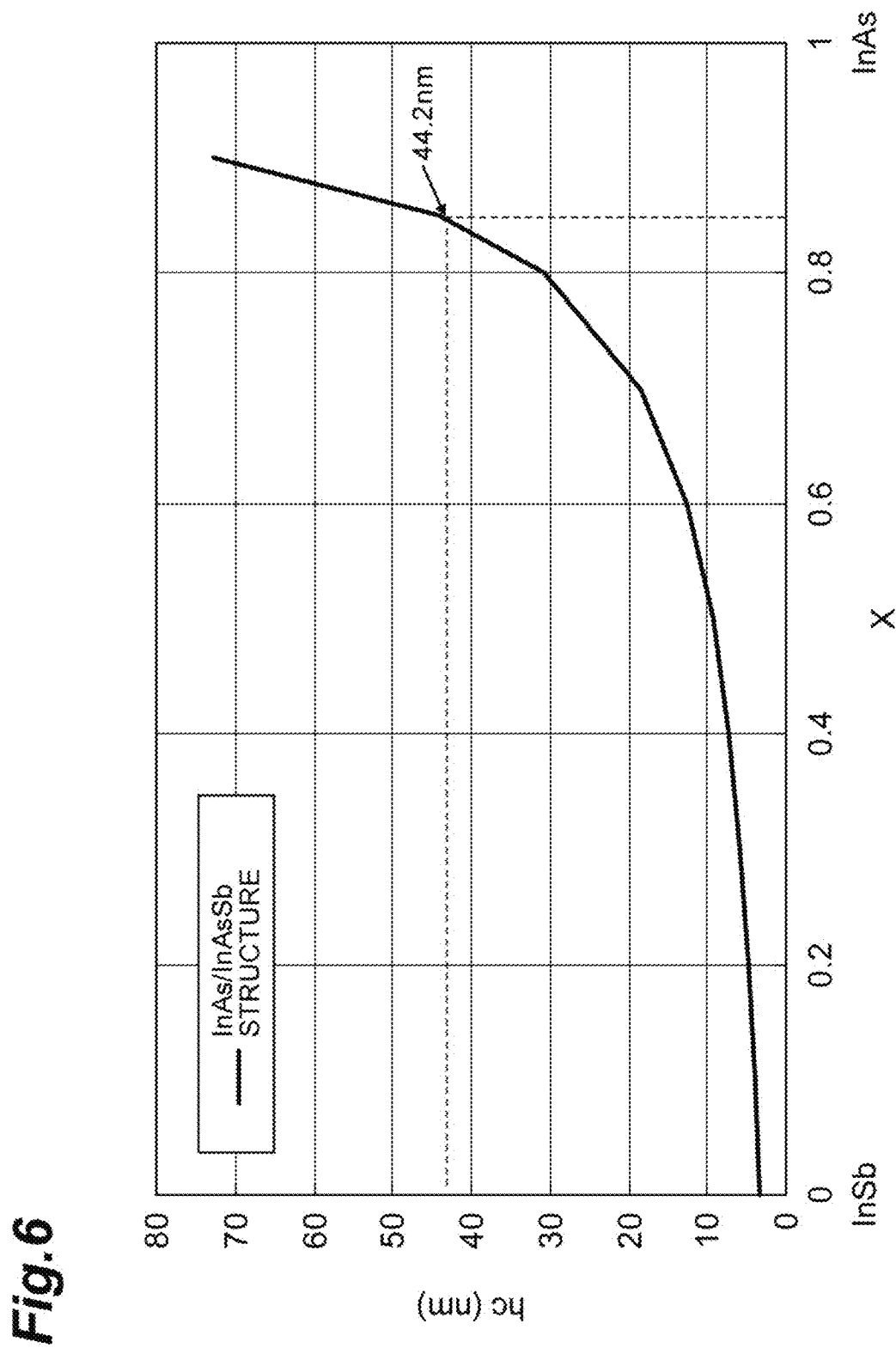
FIG. 6 is a graph showing a relation between a composition ratio X of As in InAsSb and a critical film thickness hc (nm) of an InAs layer.

FIG. 6 is a graph showing a relation between a composition ratio X of As in InAsSb and the critical film thickness hc (nm) of the InAs layer obtained by the formula described above.

As the composition ratio X of As increases, especially in the case of X=0.4 or more, hc increases sharply. In the case of X=0.8, hc=30 nm; and in the case of X=0.9, hc becomes 70%. It was confirmed that when both composition ratios X of As of the buffer layer 3 and the light absorption layer 5 were 0.85, the crystallinities of the buffer layer 4 and the light absorption layer 5 surely improved, as will be described later.

Moreover, it is preferable that with the composition ratios of As and Sb in each of the layers (InAsSb, AlInAsSb, and InAsSb) described above designated as X, 1-X, respectively, X be set to X=0.85 in the cap layer 7, the barrier layer 6, the light absorption layer 5, and the buffer layer 3. From a viewpoint of an improvement effect of the crystallinity, a case where the value of X is not less than 0.58 and not more than 1.0 is preferable, and a case where the value of X is not less than 0.7 and not more than 0.9 is further preferable. In this case, at least, it is possible to improve the crystallinity of the light absorption layer 5 (InAsSb layer).

FIG. 8-(A) and FIG. 8-(B) are diagrams showing a layered structure used in order to perform X-ray diffraction measurement. FIG. 8-(A) shows a structure in which $InAs_XSb_{1-X}$ is formed on the GaAs substrate; FIG. 8-(B) shows a structure in which $InAs_XSb_{1-X}$, InAs, and $InAs_XSb_{1-X}$ are successively layered on the GaAs substrate. Manufacturing conditions of the respective layers are the same as those of a below-described example.

Figure 9:
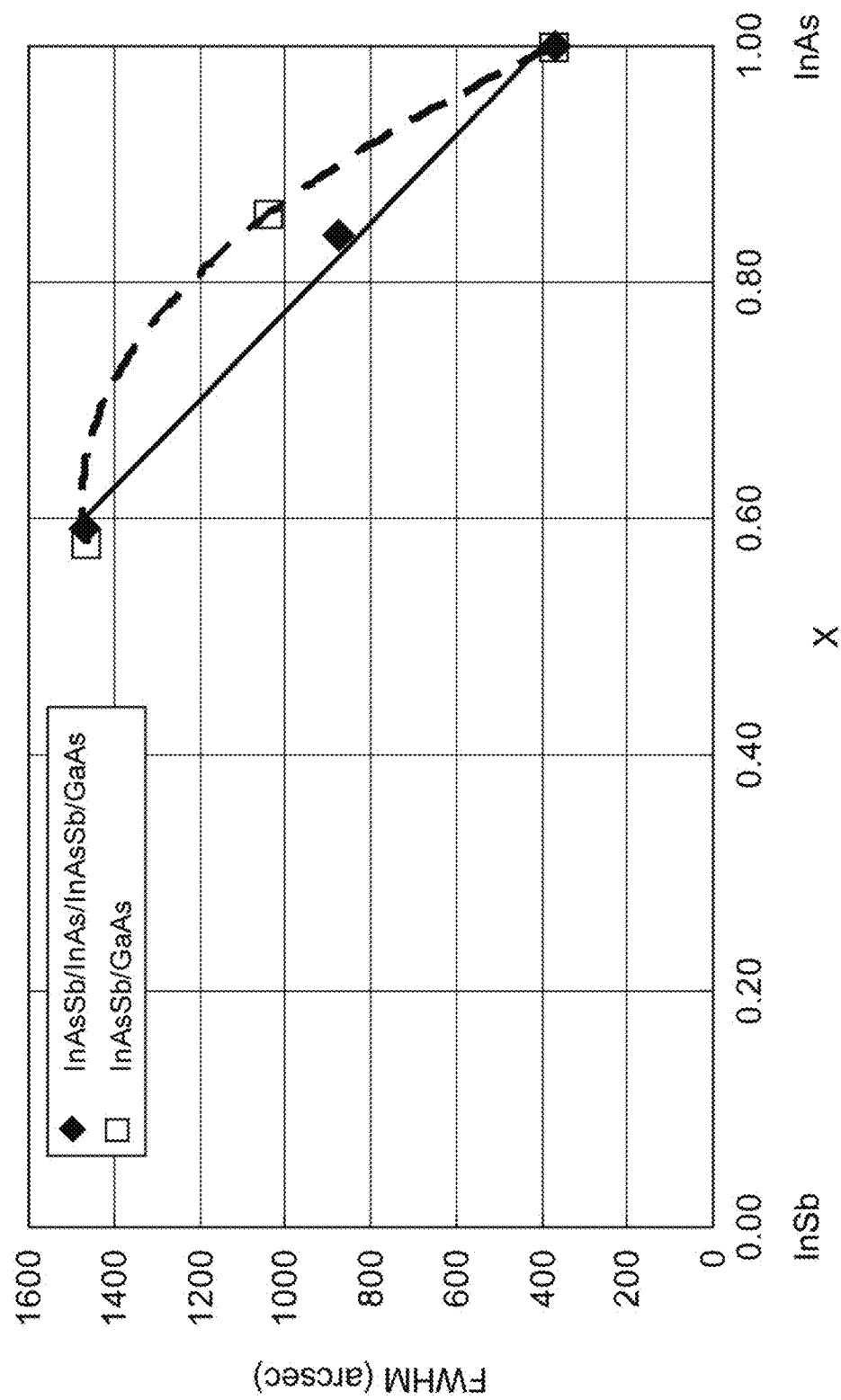
FIG. 9 is a graph showing a relation between the composition ratio X of As in an InAsSb layer and a full width at half maximum FWHM (arcsec) of a locking curve in the X-ray diffraction measurement.

FIG. 9 is a graph showing a relation between the composition ratio X of As in the InAsSb layer and a full width at half maximum FWHM (arcsec) of a locking curve of X-ray diffraction from the InAsSb layer in the X-ray diffraction measurement. Square marks are for a graph of a configuration of FIG. 8-(A), and diamond marks are for a graph of a configuration of FIG. 8-(B). Incidentally, X was made to change to be X=0.58, 0.85, and 1.00 in the graph.

It is understood that when X is at least not less than 0.58 and not more than 1.0, the FWHM becomes small and crystallinity of the InAsSb layer improves. It is understood that when X is not less than 0.7 and not more than 0.9, the FWHM becomes small and the crystallinity of the InAsSb layer improves.

Moreover, if the light absorption layer 5 has a suitable thickness (larger than 117 nm) except for thicknesses of the buffer layer 3 and the buffer layer 4 that affect optical absorption and crystallinities, there will be few reasons such that a large change will occur in operation effect even when a thickness variation occurs in a range of not less than 0.2×d and not more than 5×d with each thickness described above of each of the layers designated as d; therefore, the photodiode functions as the infrared detection element with the excellent characteristics.

Next, the improvement effects of crystallinities of the buffer layer 4 (InAs layer) and the light absorption layer 5 (InAsSb layer) grown on the buffer layer 3 (InAsSb layer) are described.

Example

Compound semiconductor layers as shown in FIG. 2 were layered on the semiconductor substrate 1 of GaAs using the MBE method. In the MBE method, a substrate is disposed in a vacuum vessel in which crucibles for supplying materials are disposed, each chemical element that makes up each layer is put into each independent crucible, and the respective chemical elements are supplied simultaneously to the respective layers by heating these crucibles to make each of the layers grow on its base layer. When an impurity is doped, the impurity (Zn, Si, or the like) acting as the dopant is supplied to layers under growth. When a non-doped semiconductor layer is grown, the impurity is not supplied. Incidentally, when the impurity is not supplied, the crystallinity of the semiconductor layer improves. In the structure of FIG. 2, a growth temperature of GaAs was set to 690° C., a growth temperature of InAsSb was set to 610° C., a growth temperature of InAs was set to 620° C., and a growth temperature of AlInAsSb was set to 630° C. Moreover, X was such that X=0.85 and a composition ratio of Al in the AlInAsSb layer was set to 0.3. After the growth of the layers, the etching described above and formation of the protection layer 8 made of $SiO_2$ were formed, and further, the electrodes 9 and 10 of Al were formed on the cap layer 7 and the buffer layer 4.

Incidentally, each semiconductor layer can also be formed by using a MOVPE (metal organic vapor phase epitaxy) method.

Comparative Example

In the case where the InAsSb layer was directly formed by the MBE method on a semi-insulating GaAs substrate as a preliminary-step experiment of a comparative example, when a cross-sectional TEM image (transmission electron microscope image) was observed, as compared with the example, a very large amount of dislocation defects such as misfit dislocation were observed. These defects extended in an oblique direction from an interface of the substrate and the InAsSb layer. Since a buffer layer is not used in this structure at all, it is a result that is expected. Then, a structure that was identical to that of the literature of the conventional technology described above where a film thickness less than or equal to the critical film thickness hc was believed to be preferable was manufactured as the comparative example.

That is, a structure that used multiple InAs layers and InAsSb layers whose thicknesses were less than or equal to the critical film thickness instead of the buffer layer 4 of InAs acting as the intermediate layer in the example was formed. In other words, in the comparative example, a 200 nm (=0.2 μm) thick superlattice buffer layer (a structure in which five InAsSb/InAs pairs are layered; a total of ten layers each of which has a thickness of 20 nm) was adopted instead of the buffer layer 4. Although formation methods, impurity concentrations, and the growth temperatures of AlInAsSb, GaAs, InAsSb, and InAs were the same as those of the example, the thicknesses were set as follows. A material/a conductivity type/a thickness of each layer are as follows.

Cap layer 7:
InAsSb/P type/0.5 μm
Barrier layer 6:
AlInAsSb/P type/0.02 μm
Light absorption layer 5:
InAsSb/N⁻ type (non-doped)/2.0 μm
Buffer layer:
InAsSb/N type/1.0 μm
Buffer layer 4:
Superlattice buffer layer as mentioned above
Buffer layer 3:
InAsSb/N⁻ type (non-doped)/0.3 μm
Buffer layer 2:
GaAs/semi-insulating type (non-doped)/0.2 μm
Semiconductor substrate 1:
GaAs/semi-insulating type 250 μm Incidentally, other conditions were set identical to those of the example.

Experimental Result

Figure 3:
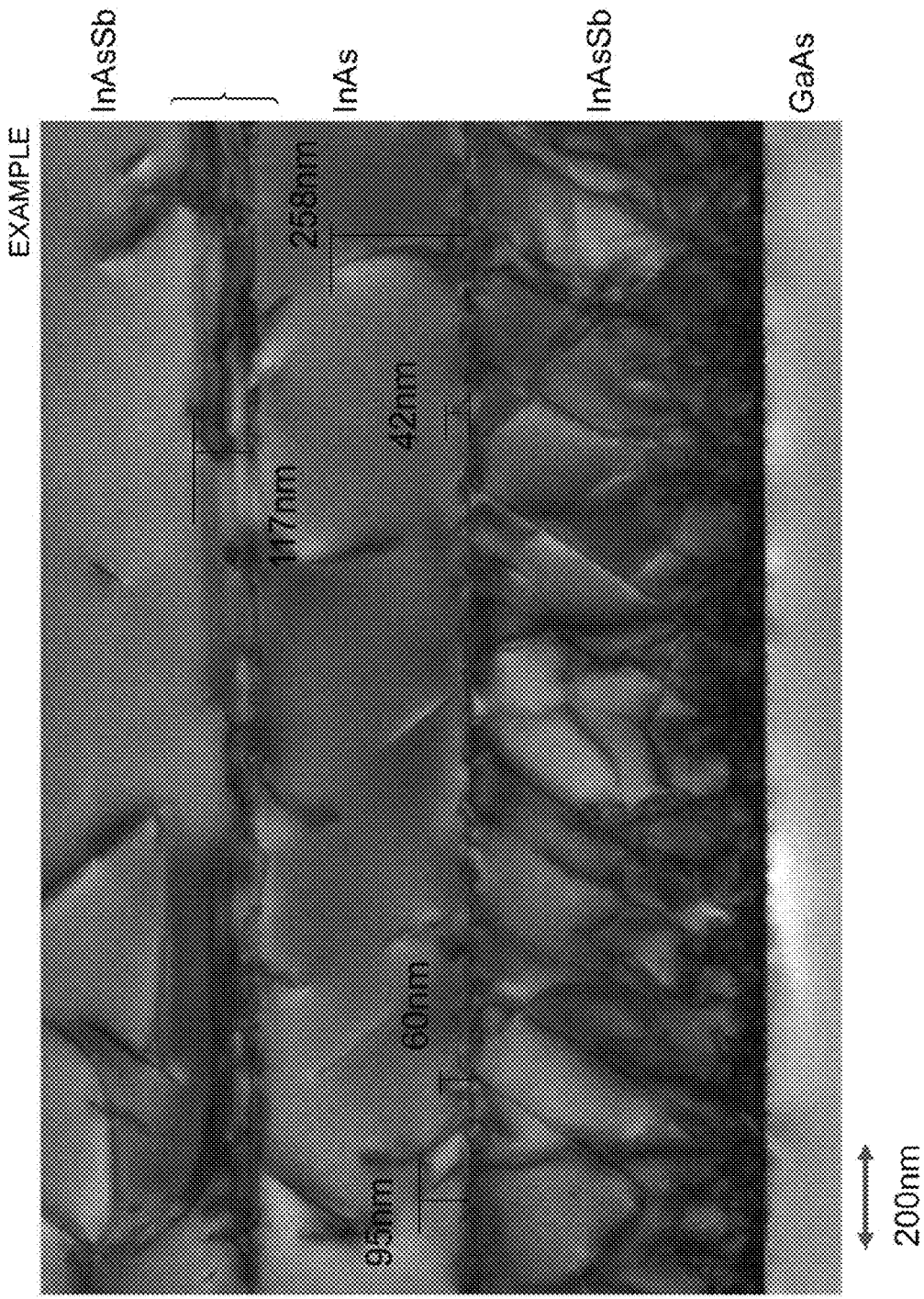
FIG. 3 is a diagram showing a cross-sectional TEM image (an example) of an InAsSb/InAs/InAsSb structure.
Figure 4:
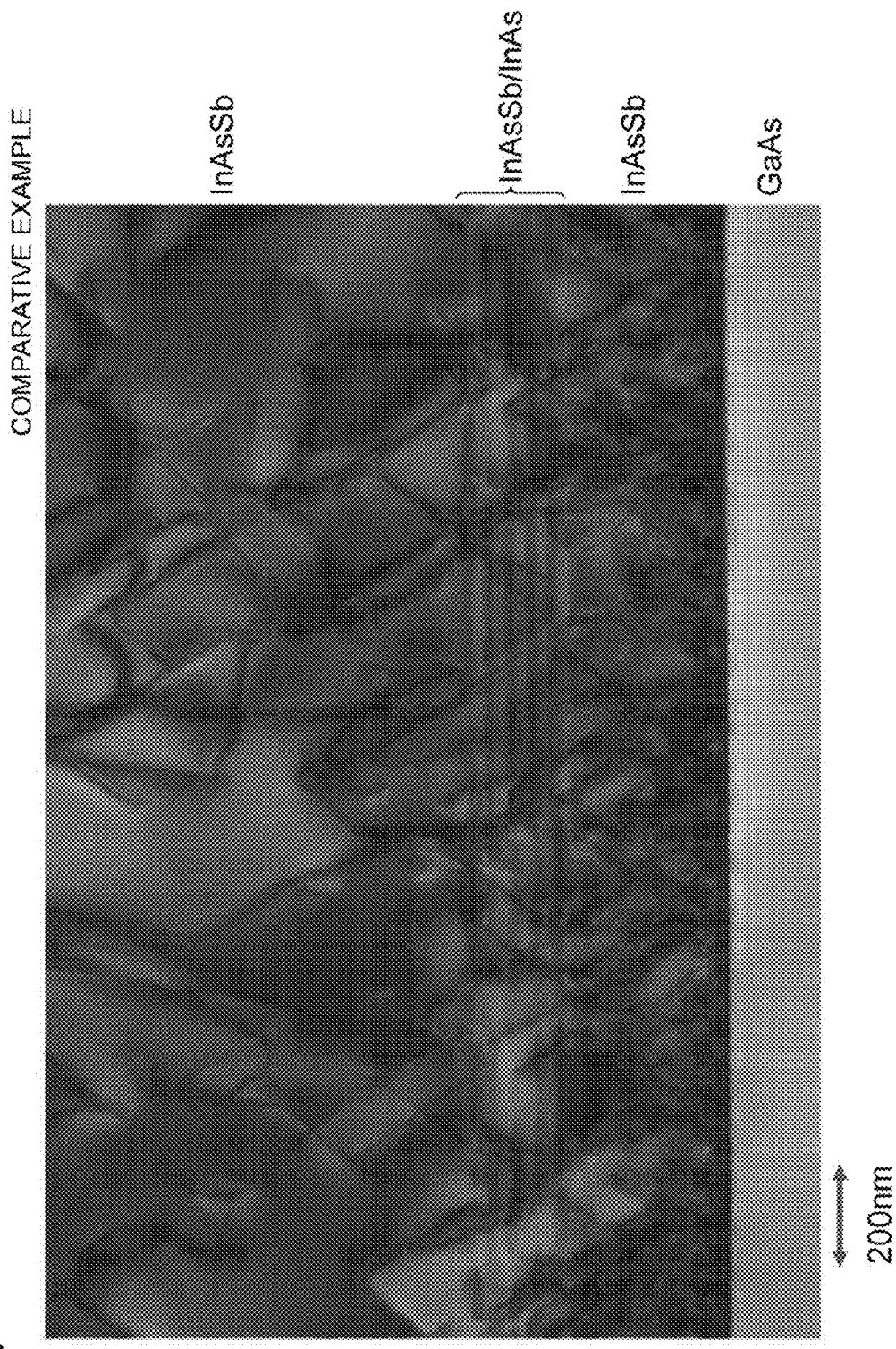
FIG. 4 is a diagram showing a cross-sectional TEM image (a comparative example) of an InAsSb/(InAsSb/InAs superlattice structure)/InAsSb structure.

FIG. 3 is a diagram showing a cross-sectional TEM image of the InAsSb/InAs/InAsSb structure according to the example; FIG. 4 is a diagram showing a cross-sectional TEM image of an InAsSb/(InAsSb/InAs superlattice structure)/InAsSb structure according to the comparative example.

In the example, the crystallinities of the InAs layer (buffer layer 4) and the InAsSb layer (light absorption layer 5) that were formed on the InAsSb layer (buffer layer 3) improved to be better than the comparative example. That is, the crystallinities of the buffer layer 4 and the light absorption layer 5 improve in the case of the example where the thickness is larger than the critical film thickness without using the superlattice as compared with the case of using the InAs/InAsSb superlattice whose layers have thicknesses less than or equal to the critical film thickness.

When the cross-sectional TEM image of the comparative example is observed, it is understood that since thicknesses of the layers that make up the superlattice are thin, the growth of the crystal defect does not stop, but the crystal defect penetrates the whole superlattice layers. Conventionally, it was conducted to form the respective layers so that the respective layers may be with thin thicknesses based on a common knowledge of the person skilled in the art that when the thickness exceeds the critical film thickness, the crystallinity deteriorates; but the inventors of this application have discovered that although, according to the comparative example conforming to the conventional method, the deterioration of the crystallinity of each of the InAs layers is suppressed individually, the growth of the crystal defect cannot be stopped as a whole. Then, the inventors have found out that the growth of the crystal defect is stopped by using the InAs layer having the thickness that exceeds the critical film thickness.

When the cross-sectional TEM image of FIG. 3 is observed, a state in a growth process of each layer can be grasped in general. That is, although crystallinity deteriorated at positions lower than the interface between the lower buffer layer 3 (InAsSb layer) and the buffer layer 4 (InAs layer) by approximately 42 nm or less, if the distance exceeds this, the crystallinity will improve remarkably. That is, it is understood that if a thickness of the InAs layer is at least larger than approximately 42 nm, the crystallinity will improve. This value, about 42 nm, mostly agrees with a critical film thickness hc of 44.2 nm determined based on a calculation. That is, it is understood that if the thickness of the InAs layer is at least larger than the critical film thickness hc, the improvement effect of the crystallinities of the InAs layer and the InAsSb layer thereon can be obtained.

Moreover, when the cross-sectional TEM image of FIG. 3 is further observed, each of dislocation defects extending from the interface of the InAs layer/InAsSb layer to a position of 60 nm, a position of 95 nm, and a position of 258 nm is observed. Therefore, it is further preferable that the thickness of the InAs layer be larger than 60 nm (=hc× 1.357), be larger than 95 nm (=hc×2.149), or be larger than 258 nm (=hc×5.837). That is, this is because a defect density on a growth face of the InAs layer decreases as the thickness increases.

Moreover, since the InAsSb layer of the upper part acting as the light absorption layer 5 deteriorates in crystallinity from its interface with the InAs layer to a position 117 nm away, it is preferable that a thickness of the light absorption layer 5 be larger than 117 nm.

Figure 5:
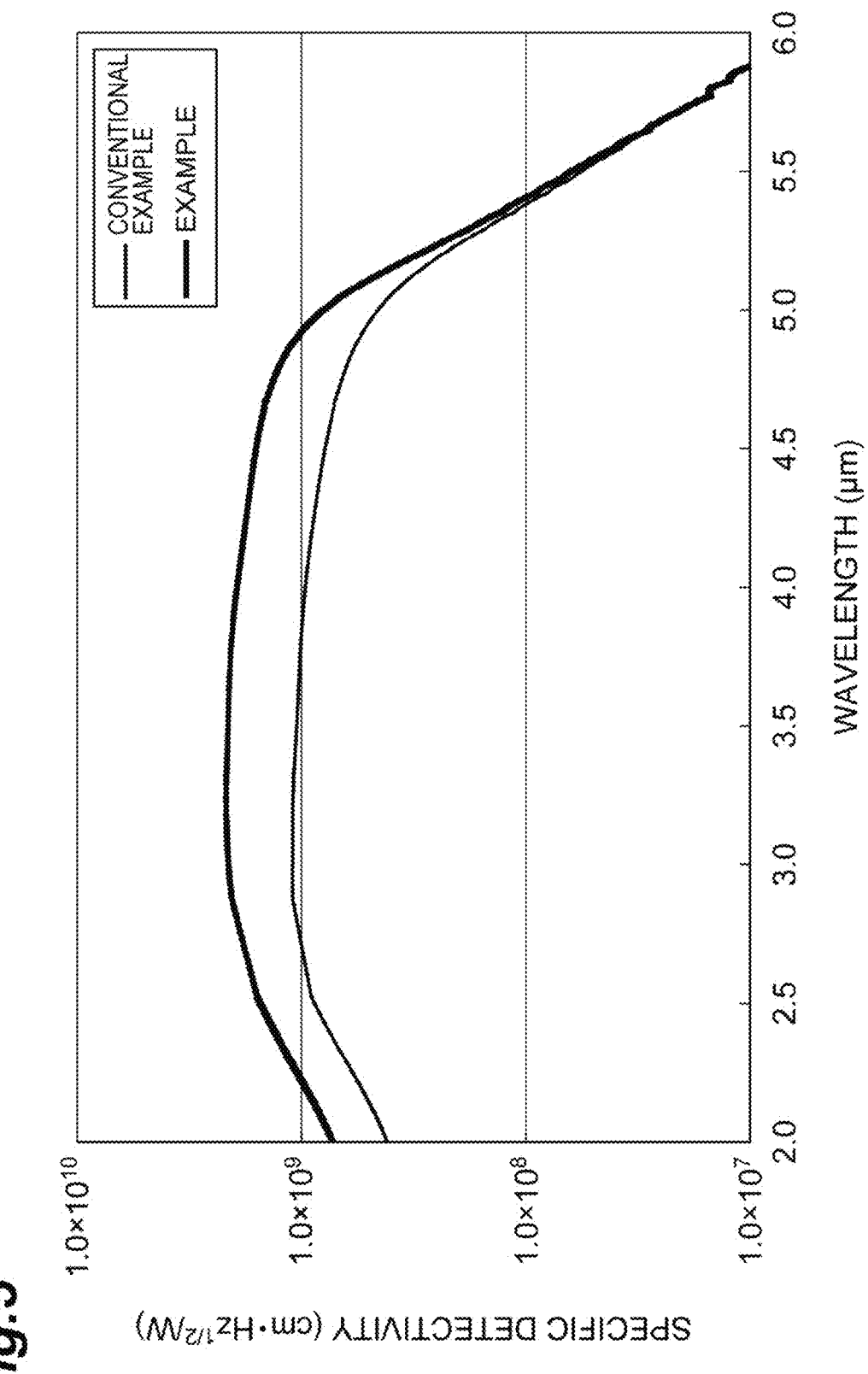
FIG. 5 is a graph showing a relation between a wavelength (μm) of incident light and a specific detectivity $(cm \cdot Hz^{1/2}/W)$.

FIG. 5 is a graph showing a relation between the wavelength (μm) of incident light (infrared radiation) and the specific detectivity (cm·Hz$^{1/2}$/W) of the infrared detection element. The specific detectivity indicates a sensitivity per unit area of the infrared detection element.

As is clear from the graph, in a range of wavelength of 2.0 μm to 5.8 μm of the infrared radiation, the specific detectivity of the example shows values higher than the specific detectivity of the comparative example. Moreover, the specific detectivity of the example becomes approximately a constant value in a range of wavelength of 3.0 μm to 4.0 μm and its maximum value is $2.0 \times 10^9$ (cm·Hz$^{1/2}$/W) or more.

As described above, also from a viewpoint of electric properties, the infrared detection element of the example has proven to be superior to the infrared detection element of the comparative example. Incidentally, in the infrared element described above, impurities and compound semiconductors of such a grade as do not have a large influence on the characteristics may be used. Furthermore, the infrared detection element described above can also be used for various usages as a sensor capable of room temperature operation.

REFERENCE SIGNS LIST

1 . . . Semiconductor substrate,
2 . . . Buffer layer,
3 . . . Buffer layer,
4 . . . Buffer layer,
5 . . . Light absorption layer,
6 . . . Barrier layer,
7 . . . Cap layer,
8 . . . Protection layer,
9, 10 . . . Electrode,
IR . . . Infrared radiation.

The invention claimed is:

1. An infrared detection element comprising:
a first layer consisting of InAsSb;
an InAs layer grown on the first layer; and
a second layer consisting of InAsSb grown on the InAs layer,
wherein a critical film thickness hc of the InAs layer and a thickness t of the InAs layer satisfy a relation of hc<t,
wherein each of composition ratios X of As in the first layer and the second layer is not less than 0.7 and not more than 0.9.

2. The infrared detection element according to claim 1, wherein each of composition ratios X of As in the first InAsSb layer and the second InAsSb layer is not less than 0.7 and less than 0.9.

3. The infrared detection element according to claim 1, wherein the thickness t of the InAs layer further satisfies t≤2.0 μm.

4. The infrared detection element according to claim 2, wherein the thickness t of the InAs layer further satisfies t≤2.0 μm.

* * * * *